US007019976B1

(12) United States Patent
Ahmad et al.

(10) Patent No.: US 7,019,976 B1
(45) Date of Patent: Mar. 28, 2006

(54) METHODS AND APPARATUS FOR THERMALLY COUPLING A HEAT SINK TO A CIRCUIT BOARD COMPONENT

(75) Inventors: Mudasir Ahmad, Santa Clara, CA (US); Kenneth Hubbard, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 84 days.

(21) Appl. No.: 10/454,705

(22) Filed: Jun. 4, 2003

(51) Int. Cl.
*H05K 7/20* (2006.01)

(52) U.S. Cl. .................... 361/704; 165/80.3; 165/185; 174/16.3; 257/718; 257/719; 361/710; 361/719

(58) Field of Classification Search ............... 165/80.2, 165/80.3, 185; 174/16.3; 257/706–707, 257/712–713, 718–719, 726–727; 361/688–689, 361/699, 704–710, 719–720
See application file for complete search history.

(56) References Cited

U.S. PATENT DOCUMENTS 4,415,025 A * 11/1983 Horvath ...................... 165/185
4,479,140 A * 10/1984 Horvath ...................... 257/713
5,548,090 A * 8/1996 Harris ........................ 174/252
6,430,052 B1 8/2002 Kordes et al. .............. 361/719
6,545,352 B1 * 4/2003 Ruckdeschel ............... 257/718
6,714,416 B1 3/2004 McLeod et al. ............ 361/719
6,728,104 B1 4/2004 Ahmad et al. .............. 361/704
6,856,511 B1 2/2005 Viernes et al. .............. 361/704

* cited by examiner

*Primary Examiner*—Gregory D Thompson
(74) *Attorney, Agent, or Firm*—Bainwoodhuang; David E. Huang, Esq.

(57) ABSTRACT

A heat sink has a flexure member attached to a base of the heat sink and located between the base and an associated circuit board component. As the heat sink attaches to a circuit board carrying the circuit board component, the flexure member conforms to the surface of the circuit board component, thereby thermally contacting the circuit board component. The flexure member absorbs local tolerance differences on the circuit board component to provide a relatively uniform stress across the surface of the circuit board component. The flexure member further limits the amount of stress generated by the heat sink on the circuit board component. When used in conjunction with a heat sink spanning several circuit board components, the flexure member absorbs global tolerance differences among the circuit board components, thereby providing relatively uniform stresses to all of the circuit board components and limiting the amount of stress experienced by any one circuit board component.

18 Claims, 6 Drawing Sheets

METHODS AND APPARATUS FOR THERMALLY COUPLING A HEAT SINK TO A CIRCUIT BOARD COMPONENT

BACKGROUND OF THE INVENTION

A typical circuit board includes a section of circuit board material (e.g., fiberglass, copper, vias, etc.) and circuit board components that are mounted to the section of circuit board material. Examples of circuit board components include integrated circuits (ICs), resistors, and inductors. Typically, these circuit board components generate heat during operation. A fan assembly typically generates an air stream that passes over the components and carries the heat away. The air stream removes the heat so that the components do not operate in an unsafe temperature range, i.e., an excessively high temperature range that would cause the components to operate improperly (e.g., generate a signal incorrectly) or sustain damage (e.g., overheat, burnout, etc.).

Some ICs include heat sinks to facilitate cooling. In general, a heat sink is a flanged metallic device that contacts a package of the IC. Certain conventional heat sinks maintain thermal contact with the corresponding IC by attaching to the circuit board carrying the IC using mounting holes or through holes, defined by the circuit board, located in proximity to the IC package. As the IC generates heat, heat flows from the IC package to the heat sink, and dissipates into the surrounding air. The air stream generated by the fan assembly then carries the heat away thus cooling the IC.

As the power requirements for ICs increases, the amount of heat generated by relatively high powered ICs also increases. In turn, the relatively high powered ICs require larger heat sinks having larger surface areas for heat transfer and heat dissipation of the heat created by the ICs. Manufacturers, therefore, conventionally use relatively large heat sinks having bases that are larger than the footprint of the IC packages. Use of heat sinks having relatively large bases increases the space available for additional flanges, or fins, on the heat sink to increase the surface area of the heat sink and allow increased heat dissipation by the IC. A heat sink having a relatively large base, however, minimize the space available for placement of a similar large base heat sink on an adjacent IC. For example, the relatively large base of such a heat sink can impinge upon the relatively large base of a heat sink of an adjacent IC.

To minimize impingement of adjacent heat sinks on adjacent ICs, manufacturers conventionally utilize a ganged heat sink (e.g., several interconnected heat sinks) that span or cover several IC packages on the circuit board. The ganged heat sink provides thermal dissipation for several high powered ICs without geometric impingement caused by use of several separate large heat sinks. For example, a manufacturer places the base of the ganged heat sink in thermal contact with the packages of multiple ICs on he circuit board. The manufacturer secures the ganged heat sink to the circuit board carrying the ICs to maintain thermal contact between the ganged heat sink and the multiple ICs during operation.

SUMMARY OF THE INVENTION

Conventional techniques for thermally coupling a heat sink to a circuit board component suffer from a variety of deficiencies.

As described above, in order to provide adequate thermal dissipation for multiple high powered ICs in a circuit board, manufacturers use ganged heat sinks that thermally contact several IC packages on the circuit board. Mechanical tolerance differences exist, however, among IC packages on conventional circuit boards. During the assembly process, a manufacturer places the base of ganged heat sink in contact with multiple IC packages on a circuit board and secures the ganged heat sink to the circuit board. To ensure adequate thermal transfer between the ganged heat sink and the IC packages, the base of the ganged heat sink physically contacts each of the IC packages. The mechanical tolerance differences among the IC packages, however, cause the ganged heat sink to generate potentially large stresses on one or more of the IC packages, thereby increasing the risk of failure of the ICs.

For example, certain ICs attach to the circuit board using a solder ball array. Conventional solder ball arrays include multiple solder balls, each solder ball having a diameter of approximately 1 mm. When a manufacturer places a ganged heat sink in thermal contact with multiple ICs having the solder ball arrays, the ganged heat sink can generate a pressure or stress of up to approximately 80 and 90 pounds per square inch (psi) on the IC packages. Such stress can fracture the solder joints connecting the solder balls to the corresponding surface mount pads oh the circuit board and lead to the malfunctioning of the ICs.

To minimize the amount of stress generated by a heat sink on the circuit board components, manufacturers conventionally use custom designed heat sinks. Such custom designed heat sinks apply a controlled amount of stress on the associated circuit board components during operation, where the applied stress is less than the fracture stress of the solder joints of the solder ball array. The custom heat sinks, however, are typically designed on a case-by-case basis and are typically specific to a particular application. Use of such custom heat sinks, therefore, is relatively costly and increases the cost of goods sold (COGS) for a circuit board utilizing custom heat sinks.

As described above, when a heat sink thermally contacts a circuit board component, the heat sink conventionally attaches to a circuit board via through holes or mounting holes defined by the circuit board and in proximity to (e.g., located about a perimeter of) the circuit board component. The proximity of the through holes with respect to the circuit board component affects the amount of stress generated by the heat sink on the circuit board component. With the through holes located in proximity to the circuit board component, when the heat sink attaches to the circuit board, the heat sink generates a stress on the circuit board component that provides thermal contact between the heat sink and the circuit board component. The location of the through holes, however, can interfere or impinge upon the availability of circuit board real estate for traces or electrical routes from the circuit board component to other portions of the circuit board.

By contrast to the prior heat sink attachment mechanisms, embodiments of the present invention significantly overcome such deficiencies and provide mechanisms and techniques for thermally coupling a heat sink to a circuit board component. A heat sink has a flexure member, attached to a base of the heat sink and located between the base and an associated circuit board component. As the heat sink attaches to a circuit board carrying the circuit board component, the flexure member conforms to the surface of the circuit board component, thereby thermally contacting the circuit board component. The flexure member absorbs local tolerance differences on the circuit board component to provide a relatively uniform stress across the surface of the circuit board component. The flexure member also limits the amount of stress generated by the heat sink on the circuit board component when the heat sink attaches to the circuit board. When used in conjunction with a heat sink spanning several circuit board components, the flexure member absorbs global tolerance differences among the circuit board components, thereby providing relatively uniform stresses to all of the circuit board components and limiting the amount of stress experienced by any one circuit board component.

In one arrangement, a heat sink assembly has a heat sink having a base and a flexure member configured to position between the base of the heat sink and a circuit board component of a circuit board. The flexure member has an attachment portion fastened to, and in thermal communication with, the heat sink. The flexure member also has a deflection portion integrally formed with the attachment portion where the deflection portion is configured to thermally communicate with the circuit board component and is configured to conform to a surface of the circuit board component during attachment of the heat sink to the circuit board. With the deflection member conforming to the surface of the circuit board component, the heat sink assembly limits the amount of stress generated on the circuit board component, thereby minimizing a risk of fracture of a solder joint between the circuit board component and associated circuit board caused by "overloading" of the circuit board component.

In one arrangement, the deflection portion defines a substantially curved portion relative to the attachment portion where the substantially curved portion is configured to flatten relative to the circuit board component surface during attachment of the heat sink to the circuit board. The substantially curved portion provides contact between the heat sink and a package die center of the circuit board component where the package die center is defined as the approximate heat source or the approximate location of the circuit board component that generates the largest amount of heat relative to the circuit board component. The substantially the curved portion provides thermal contact between the heat sink and the heat source of the circuit board component and, therefore, relatively efficient thermal dissipation of heat for the circuit board component.

In one arrangement, the flexure member has multiple attachment portions fastened to, and in thermal communication with, the heat sink. The flexure member also has multiple deflection portions integrally formed with the attachment portions. Each of the plurality of deflection portions are located between two adjacent attachment portions. Each of the plurality of the deflection portions configured to thermally communicate with the circuit board component and configured to conform to the surface of the circuit board component during attachment of the heat sink to the circuit board. Configuring the flexure member with multiple deflection portions allows the flexure member, and the heat sink, to thermally contact multiple circuit board components and, therefore, provide a relatively large thermal transfer (e.g., cooling) capacity to the circuit board assembly.

The features of the invention, as described above, may be employed in electronic equipment and methods such as those of Cisco Systems of San Jose, Calif.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, with emphasis instead being placed upon illustrating the embodiments, principles and concepts of the invention.

DETAILED DESCRIPTION OF EMBODIMENTS

Embodiments of the present invention provide mechanisms and techniques for thermally coupling a heat sink to a circuit board component. A heat sink has a flexure member attached to a base of the heat sink and located between the base and an associated circuit board component. As the heat sink attaches to a circuit board carrying the circuit board component, the flexure member conforms to the surface of the circuit board component, thereby thermally contacting the circuit board component. The flexure member absorbs local tolerance differences on the circuit board component to provide a relatively uniform stress across the surface of the circuit board component. The flexure member also limits the amount of stress generated by the heat sink on the circuit board component when the heat sink attaches to the circuit board. When used in conjunction with a heat sink spanning several circuit board components, the flexure member absorbs global tolerance differences among the circuit board components, thereby providing relatively uniform stresses to all of the circuit board components and limiting the amount of stress experienced by any one circuit board component.

Figure 1:
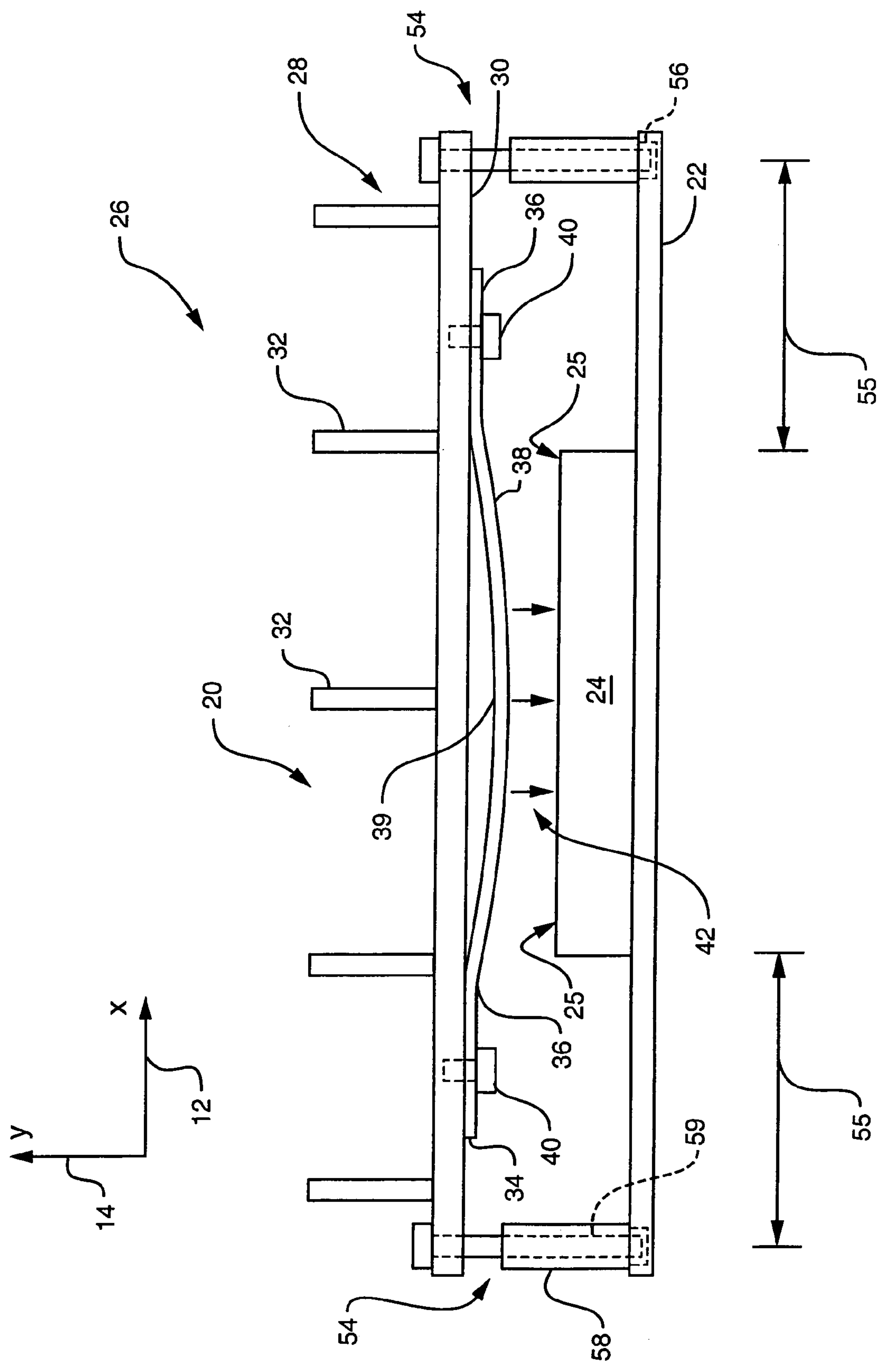
FIG. 1 illustrates a heat sink assembly, according to one embodiment of the invention.
Figure 2:
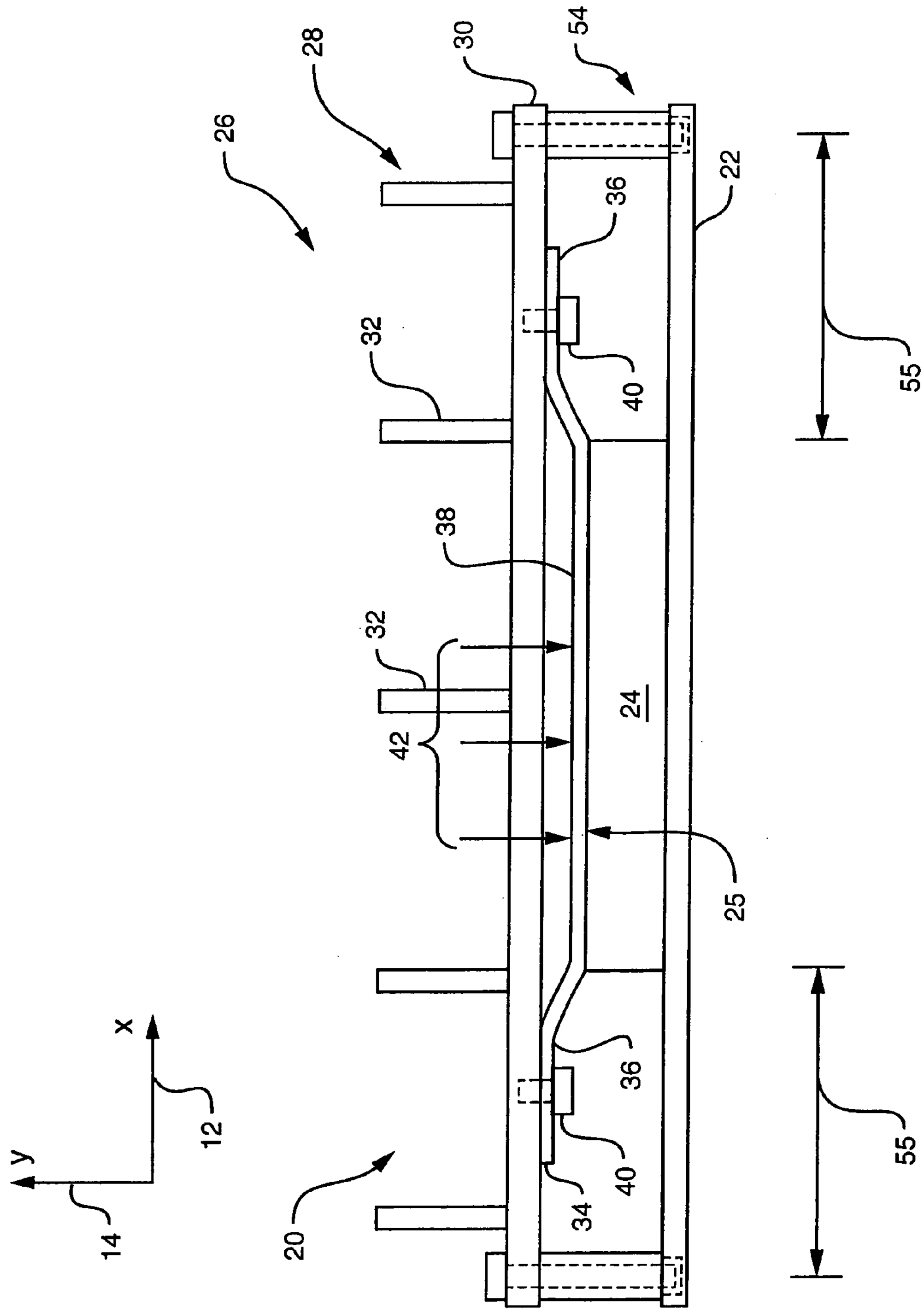
FIG. 2 illustrates the heat sink assembly of FIG. 1 during operation, according to one embodiment of the invention.

FIGS. 1 and 2 illustrate a heat sink assembly 20 according to one embodiment of the invention. The heat sink assembly 20 includes a heat sink 28 and a flexure member 34. The heat sink assembly 20 mounts to a circuit board component 24, such as an IC, attached to a circuit board 22. The combination of the heat sink assembly 20, the circuit board component 24, and the circuit board 22 forms a circuit board assembly 26.

The heat sink 28, such as a flanged heat sink, has a base 30 and a plurality of fins 32. The base 30 is configured to thermally contact a surface 25 (e.g., a top surface) of the circuit board component 24 to direct heat generated by the circuit board component 24 to the fins 32 of the heat sink 28. The fins 32 dissipate the heat away from the circuit board component 24 by way of convection. For example, an air stream (not shown) travels along a z-axis direction 16 (e.g. a direction directed into or out of the page) relative to the heat sink 28. The air stream carries the heat received by the fins 32 from the circuit board component 24 away from the circuit board component 24.

The flexure member 34, in one arrangement, is configured as a flexible strip of thermally conductive material and attaches to the base 30 of the heat sink 28 and is oriented between the heat sink 28 and the circuit board component 24. Based upon the orientation of the flexure member 34, the flexure member 34 thermally couples the heat sink 28 to the circuit board component 24. For example, the flexure member 34 transfers heat generated by the circuit board component 24 to the heat sink 28, thereby minimizing the operating temperature of the circuit board component 24. The flexure member 34 also absorbs a stress generated by the heat sink 28 on the circuit board component 24 (e.g., the surface 25 of the circuit board component 24) when heat sink 28 attaches to the circuit board 22. By absorbing the stress generated by the heat sink 28 on the circuit board component 24, the flexure member 34 minimizes damage to the circuit board component 24 otherwise caused by relatively large stresses placed on the circuit board component 24.

In one arrangement, the flexure member 34 is formed from a relatively high-strength copper material, such as a beryllium copper material, having a thickness of approximately 1.0 mm and a width of approximately 3.8 mm. Use of a relatively high-strength copper material in the manufacture of the flexure member 34 provides the flexure member 34 with adequate thermal conduction properties to conduct heat from the circuit board component 24 to the heat sink 28. For example, a flexure member 34 formed of a relatively high-strength copper material acts as a heat spreader to distribute heat from the circuit board component 24 along the base 30 of the heat sink 28, thereby allowing relatively fast thermal transfer between the heat sink 28 and the circuit board component 24. Furthermore, use of the relatively high-strength copper material to form the flexure member 34 maintains the stress generated by the flexure member within an elastic range and therefore minimizes plastic deformation of the flexure member 34 when heat sink 28 attaches to the circuit board 22. Because the stress on such a flexure member 24 remains within an elastic range, the flexure member 24 maintains thermal contact with the circuit board component 24 over time, thereby minimizing a risk of failure of the circuit board component 24 caused by exposure to relatively large temperatures.

In one arrangement, the flexure member 34 has an attachment portion 36 and a deflection portion 38. As illustrated in FIGS. 1 and 2, the attachment portion 36 fastens to the base 30 of the heat sink 28 using fasteners 40 such as screws or bolts, for example. Fastening of the attachment portion 36 of the flexure member 34 to the heat sink 28 maintain thermal communication between the flexure member 34 and the heat sink 28 thereby providing thermal transfer between the heat sink 28 and the circuit board component 24 during operation of the circuit board component 24.

The deflection portion 38 of the flexure member 34 is integrally formed with the attachment portion 36 and is configured to thermally communicate with circuit board component 24. For example, the attachment portion 36 and the deflection portion 38 of the flexure member 34 are formed from a single stamped piece of material, such as a relatively high strength copper material (e.g., beryllium copper). When the deflection portion 38 contacts the circuit board component 24, the deflection portion 38, for example, transfers heat from the circuit board component 24 to the attachment portion 36 thereby reducing the operating temperature of the circuit board component 24.

The deflection portion 38 of the flexure member 34 is further configured to conform to a surface 25 of the circuit board component 24 when the heat sink 28 attaches to the circuit board 22 (e.g., along a y-axis direction 14). For example, during assembly the deflection portion 38 initially contacts the surface 25 of the circuit board component 24 and conforms to the surface 25 of the circuit board component 24 in a "rolling" manner (e.g., the surface area of contact between the deflection portion 38 and the surface 25 of the circuit board component 24 increases as the heat sink 28 couples to the circuit board 22). By conforming to the surface 25 of the circuit board component 24, the deflection portion 38 maximizes a surface area of the deflection portion 38 in contact with a surface 25 (e.g., surface area) of the circuit board component 24, thereby providing thermal contact between the circuit board component 24 and the heat sink 28. The deflection portion 38, therefore, allows the circuit board component 24 to dissipate heat through the heat sink 28 via the flexure member 24, thereby minimizing the potential for failure of the circuit board component 24 such as caused by overheating.

In one arrangement, the deflection portion 38 conforms to central portion 42 of the circuit board component surface 25. The central portion or package die center 42 of the circuit board component 24, in one arrangement, is the approximate heat source (e.g., the location of the circuit board component 24 generating the relatively largest amount of heat) for the circuit board component 24. The deflection portion 38, therefore, provides thermal contact between the heat sink 28 and the heat source of the circuit board component 24 for relatively efficient dissipation of heat from the circuit board component 24.

In the case where the deflection portion 38 conforms to central portion 42 of the circuit board component surface 25, the deflection portion 38 generates a stress (e.g., local stress) on the central portion 42 of the circuit board component surface 25. Application of a local stress or pressure on the circuit board component surface 25, allows the flexure member 34 to be formed from a material having a relatively small compliance (e.g., relatively stiff or high-strength material) and a relatively large thermal conductance, such as a copper material. As described above, in one arrangement, the flexure member 34 is formed from a relatively high-strength copper material, such as beryllium copper having an elastic modulus of approximately 131 GPa, a yield strength of approximately 553.2 MPa, and an ultimate tensile strength of approximately 619.7 MPa. Use of such a high-strength and thermally conductive material minimizes a thermal resistance between an interface of the flexure member 34 (e.g., the deflection portion 38) and the surface 25 of the circuit board component 24.

Figure 3:
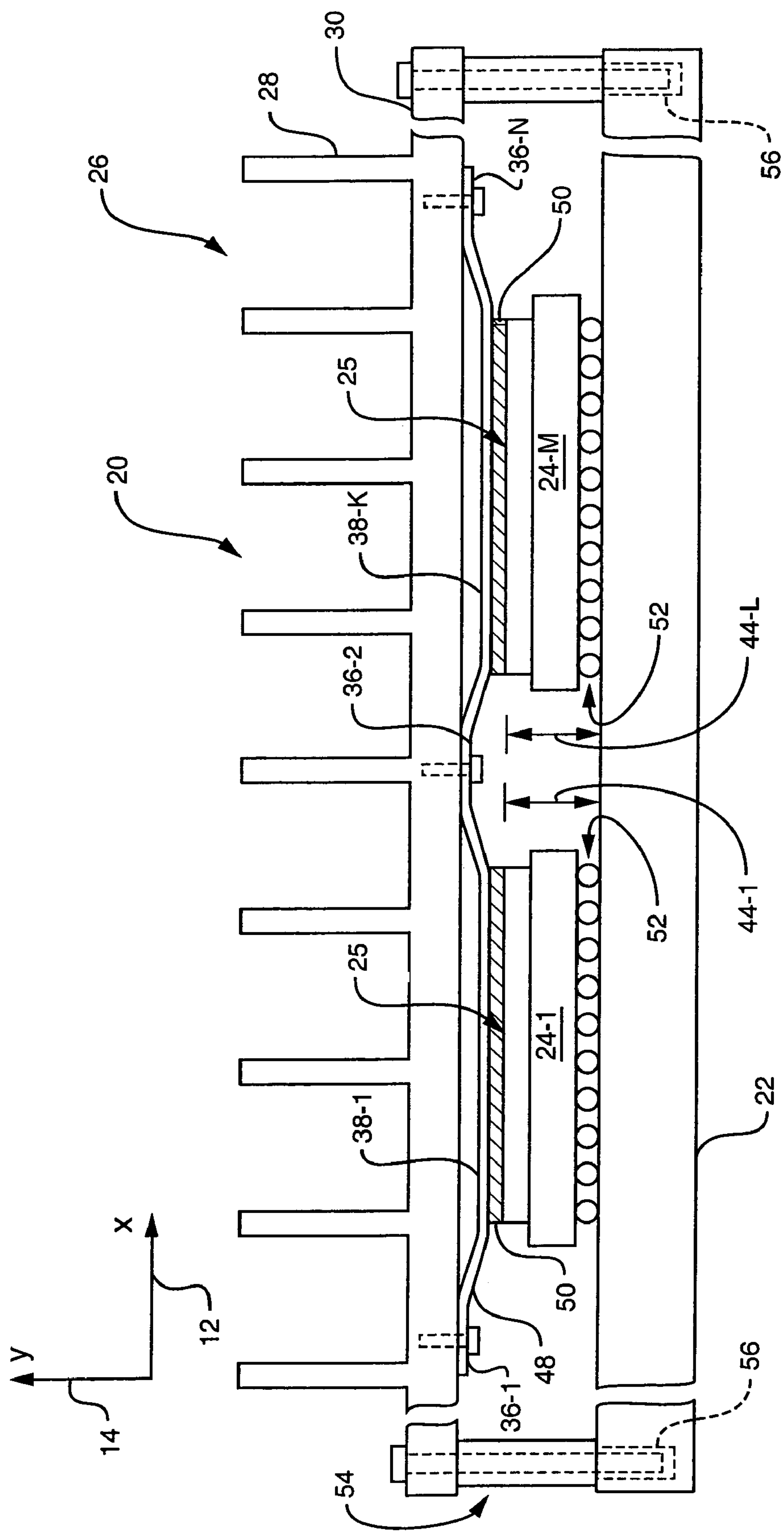
FIG. 3 illustrates a heat sink assembly for coupling to multiple circuit board components, according to one embodiment of the invention.

The deflection portion 38 of the flexure member 34, furthermore, absorbs a portion of a stress generated by the heat sink 28 on the circuit board component 24. As described above, the deflection portion 38 conforms to the surface 25 of the circuit board component 24. Such conformation limits a stress applied by the heat sink 28 on the circuit board component 24. For example, conventional heat sinks generate a stress between approximately 80 psi and 90 psi on associated circuit board components. In the case where such circuit board components attach to a circuit board by an array of solder balls, the stress between approximately 80 psi and 90 psi can cause the solder balls of the array to fracture, thereby causing the circuit board component to become inoperable. By contrast, the deflection portion 28 of the flexure member 34 deflects (e.g., conforms to the surface 25 of the circuit board component 24) when the heat sink 38 attaches to the circuit board 22 and limits the stress applied on the circuit board component 24 to between approximately 10 psi and 15 psi. Stresses within such a range minimizes potential damage to the circuit board component 24, or, in the case where the circuit board component 24 attaches to the circuit board 22 using a solder ball array 52, as shown in FIG. 3, minimizes the potential for damage to the solder ball array 52.

Returning to FIGS. 1 and 2, when the deflection portion 38 conforms to the surface 25 of the circuit board component 24 the deflection portion 38 absorbs local tolerance differences on the surface 25 of the circuit board component 24. For example, a conventional circuit board component, such as an IC, has a non-planar surface (e.g., non-planar heat sink mounting surface), defining a bow or curvature of the surface. Such a curvature of the surface forms a local tolerance difference in the IC or circuit board component 24. Because the deflection portion 38 conforms to the surface 25 of the circuit board component 24, the deflection portion 38 provides a relatively even stress distribution over the circuit board component surface 25, regardless of the local tolerance differences. The deflection portion 38 minimizes the presence of relatively high stress points or locations on the circuit board component surface 25, caused by the local tolerance differences that, otherwise, cause damage to or failure of the circuit board component 24.

In one arrangement, the deflection portion 38 defines a substantially curved portion 39, or bow, relative to the attachment portion 34. The curved portion 39 of the flexure member 34 is configured to contact the central portion 42 of the circuit board component surface 25. As described above, the central portion or package die center 42 of the circuit board component 24, in one arrangement, is the heat source (e.g., the location of the circuit board component 24 generating the relatively largest amount of heat) for the circuit board component 24. The geometry of the curved portion 39 of the flexure member 34, therefore, ensures thermal contact between the heat sink 28 and the heat source of the circuit board component 24. Such thermal contact provides relatively efficient thermal dissipation of heat for the circuit board component 24.

FIGS. 1 and 2 illustrates attachment of the heat sink assembly 20 and the circuit board 22 where the deflection portion 38 of the heat sink assembly defines the substantially curved portion 39, or bow, relative to the attachment portion 34. When a manufacturer assembles the circuit board assembly 26, the manufacture attaches the heat sink assembly 20 to the circuit board 22 using coupling mechanisms 54, such as stand-offs 58 and fasteners 59, where the fasteners 59 are configured to engage associated openings 56 defined by the circuit board 22, such as shown in FIG. 1. In FIG. 2, as the manufacturer secures the coupling mechanisms 54 to the circuit board 22 (e.g., engaging the fasteners 59 with the openings 56 of the circuit board 22), the substantially curved portion 39 of the deflection portion 38 contacts the surface 25 (e.g., a top surface or surface opposing the circuit board 22) of circuit board component 24 and flattens relative to the surface 25 of the circuit board component 24. In one arrangement, flattening of the substantially curved portion 39 applies a stress to a central portion 42 of the circuit board component 24. Flattening of the substantially curved portion 39, furthermore, provides substantially uniform thermal contact between the deflection portion 38 and the heat sink component 24.

FIGS. 1 and 2 also illustrate each of the coupling mechanisms 54 and associated openings 56 located at distances 55 from the circuit board component 24. As described above, when a heat sink thermally contacts a circuit board component, the heat sink conventionally attaches to a circuit board via through holes or mounting holes defined by the circuit board and in proximity to (e.g., located about a perimeter of) the circuit board component. With the through holes located in proximity to the circuit board component, when the heat sink attaches to the circuit board, via the through holes, the heat sink generates a stress on the circuit board component that provides thermal contact between the heat sink and the circuit board component. The location of mounting holes, however, can interfere or impinge upon the availability of circuit board real estate for traces or electrical routes from the circuit board component to other portions of the circuit board.

In one arrangement of the present heat sink assembly 26, however, the openings 56 can be located at any location on the circuit board 22. Securing of the coupling mechanisms 54 to the openings 56 in the circuit board 22 causes the heat sink 28 to compress the flexure member 34. The flexure member 34 limits the stress applied on the circuit board component 24 to between approximately 10 psi and 15 psi and provides thermal contact between the heat sink 28 and the circuit board component 24 regardless of local or global tolerance differences of the circuit board component or components 24. Because the flexure member 34 provides a stress on the circuit board component 24 that creates sufficient thermal contact between the heat sink 28 and the circuit board component 24, a manufacturer can locate the openings 56 and the coupling mechanisms at any location on the circuit board 22 (e.g., the location of the openings 56 on the circuit board 22 for the coupling mechanisms minimally affects the amount of stress provided by the flexure member 34). In such an arrangement, the openings minimally impinge upon the availability of circuit board real estate for traces or electrical routes.

FIG. 3 illustrates one arrangement of a circuit board assembly 26. As illustrated, the circuit board assembly 26 has circuit board 22, multiple circuit board components 24-1, 24-M, and a heat sink assembly 20. Heat sink assembly 20, as illustrated, has a heat sink 30 and a flexure member 48 having multiple attachment portions 36-1, 36-2, and 36-N and multiple deflection portions 38-1, 38-K.

Each attachment portion 36-1, 36-2, and 36-N of the flexure member 48 attaches, and is in thermal communication with, the heat sink 28. Also as illustrated, each deflection portion 38-1, 38-K is integrally formed between two adjacent to attachment portion 36. For example, deflection portion 38-1 is integrally formed with attachment portion 36-1 and attachment portion 36-2 while deflection portion 38-K is integrally formed between attachment portion 36-2 and attachment portion 36-N. Configuring the flexure member 48 with multiple deflection portions 38 allows the flexure member 48, and the heat sink 28, to thermally contact multiple circuit board components 24-1, 24-M. The flexure member 48, therefore, provides a relatively large thermal transfer (e.g., cooling) capacity to the circuit board assembly 26. By using such a flexure member 48 in a circuit board assembly 26, a manufacturer can increase the number of circuit board components 24 on the circuit board 22 while minimally affecting the overall temperature of the circuit board assembly (e.g., an increase in the number of circuit board components 24 in conjunction with the flexure member 48 provides a minimal or negligible increase in the temperature of the circuit board assembly 26).

In one arrangement, configuring the flexure member 48 with multiple deflection portions 38-1, 38-N allows the flexure member 58 to provide a relatively uniform amount of stress (e.g., a stress of between approximately 10 psi and 15 psi) on the circuit board component surfaces 25 of the multiple circuit board components 24-1, 24-M.

For example, during a circuit board fabrication process, a manufacturer secures the circuit board components 24-1, 24-M to the circuit board 22. The height 44-1, 44-L of each circuit board component 24-1, 24-M, relative to the circuit board 22, however, are not necessarily uniform (e.g., the height 44-1 of the circuit board component 24-1, is greater then the height 44-L of the circuit board component 24-M). Such height differentials or global tolerance differences of the circuit board components 24-1, 24-M on the circuit board 22 can lead to a conventional heat sink generating either a relatively large stress on circuit board components 24-1, 24-M (e.g., thereby creating a failure risk) or a relatively small stress on circuit board components 24-1, 24-M (e.g., thereby creating an insufficient thermal contact with the circuit board components 24-1, 24-M).

The deflection portions 38-1, 38-N of the present heat sink assembly 20 conform to the surfaces 25 of each circuit board component 24-1, 24-M and thereby absorb global tolerance differences (e.g., height disparities) among the circuit board components 24-1, 24-M. Because the deflection portions 38-1, 38-N absorb the global tolerance differences among the circuit board components 24-1, 24-M, the deflection portions 38-1, 38-N provide a relatively uniform amount of stress among the circuit board components 24-1, 24-M.

FIG. 3 illustrates, in one arrangement, the circuit board assembly 26 having a thermal interface material 50 located between the flexure member 34 and each circuit board component 24-1, 24-M. For example, the thermal transfer layer 52 is a compliant material, such as a thermal putty, that conforms to the shape of each surface 25 of the circuit board components 24-1, 24-M. The thermal interface material 50, in one arrangement, distributes the stress generated by the heat sink 28 over the surfaces 25 of the circuit board components 24-1, 24-M. In one arrangement, the thermal interface material 50 increases the contact area (e.g., minimizes the presence of non-contacting portions or air gaps) between each deflection portion 38-1, 38-K and the surface of each corresponding circuit board component 24-1, 24-M. The thermal interface material 50 therefore increases the thermal transfer between the circuit board components 24 and the heat sink 28.

As described above, the deflection portion 38 of the flexure member 34 conforms to a surface 25 (e.g., conforms to a portion of the surface 25) of the circuit board component 24 when the heat sink assembly 20 couples to the circuit board 22.

Figure 4:
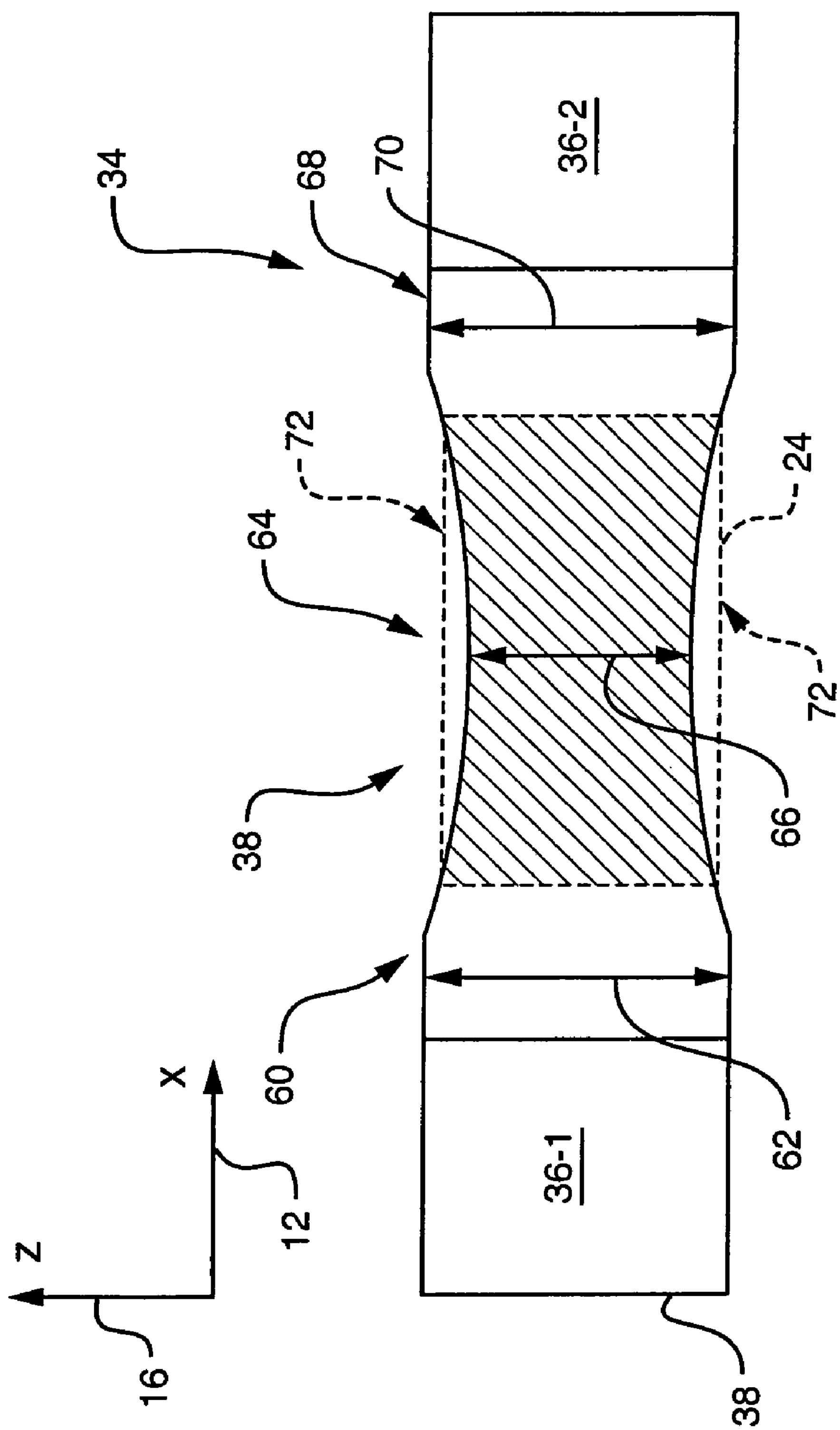
FIG. 4 illustrates a top view of a flexure member of the heat sink assembly, according to one embodiment of the invention.

FIG. 4 illustrates a top view of one arrangement of the flexure member 34. In the illustrated arrangement, the geometry of the deflection portion 38 limits the amount of contact between the deflection portion 38 and a surface area of the surface 25 of the circuit board component 24.

The deflection portion 38 has a first deflection portion 60 defining a first width 62, a central deflection portion 64 integrally formed with the first deflection portion 60 and defining a central width 66, and a second deflection portion 68 integrally formed with the central deflection portion 64 and defining a second width 70. The first deflection portion 60 is integrally formed with a first attachment portion 36-1 of the flexure member 34 while the second deflection portion 68 is integrally formed with a second attachment portion 36-2 of the flexure member 34. As illustrated, the center width 66 of the central deflection portion 64 is smaller than either the first width 62 of the first deflection portion 60 or the second width 70 of the second deflection portion 68. The central deflection portion 64, therefore, is relatively thinner than the first deflection portion 60 or the second deflection portion 68.

When the flexure member 34 contacts the circuit board component 24, in one arrangement, the central deflection portion 64 contacts the surface 25 of the circuit board component 24 and generates a stress on the circuit board component 24. For example, as illustrated in FIG. 4, the shaded area of the of the central deflection portion 64 represents the contact area between the circuit board component 24 and the flexure member 34 (e.g., the area on the circuit board component 24 stressed by the flexure member). In the flexure member 34 of FIG. 4, the width 66 of the central deflection portion 64 relative to the widths 62, 70 of the first deflection portion 62 or the second deflection portion 68 minimizes the application of a stress along an edge 72 of the circuit board component 24. By limiting the amount of stress on the edge 72 of a circuit board component 24, such as a circuit board component attached to the circuit board 22 using an array of solder balls, the flexure member 34 minimizes damage to the solder balls in proximity to the edge 72 of the circuit board component 24.

As described above, in one arrangement, the flexure member 34 is formed from a relatively high-strength copper material having a relatively low compliance (e.g., a relatively high stiffness).

Figure 5:
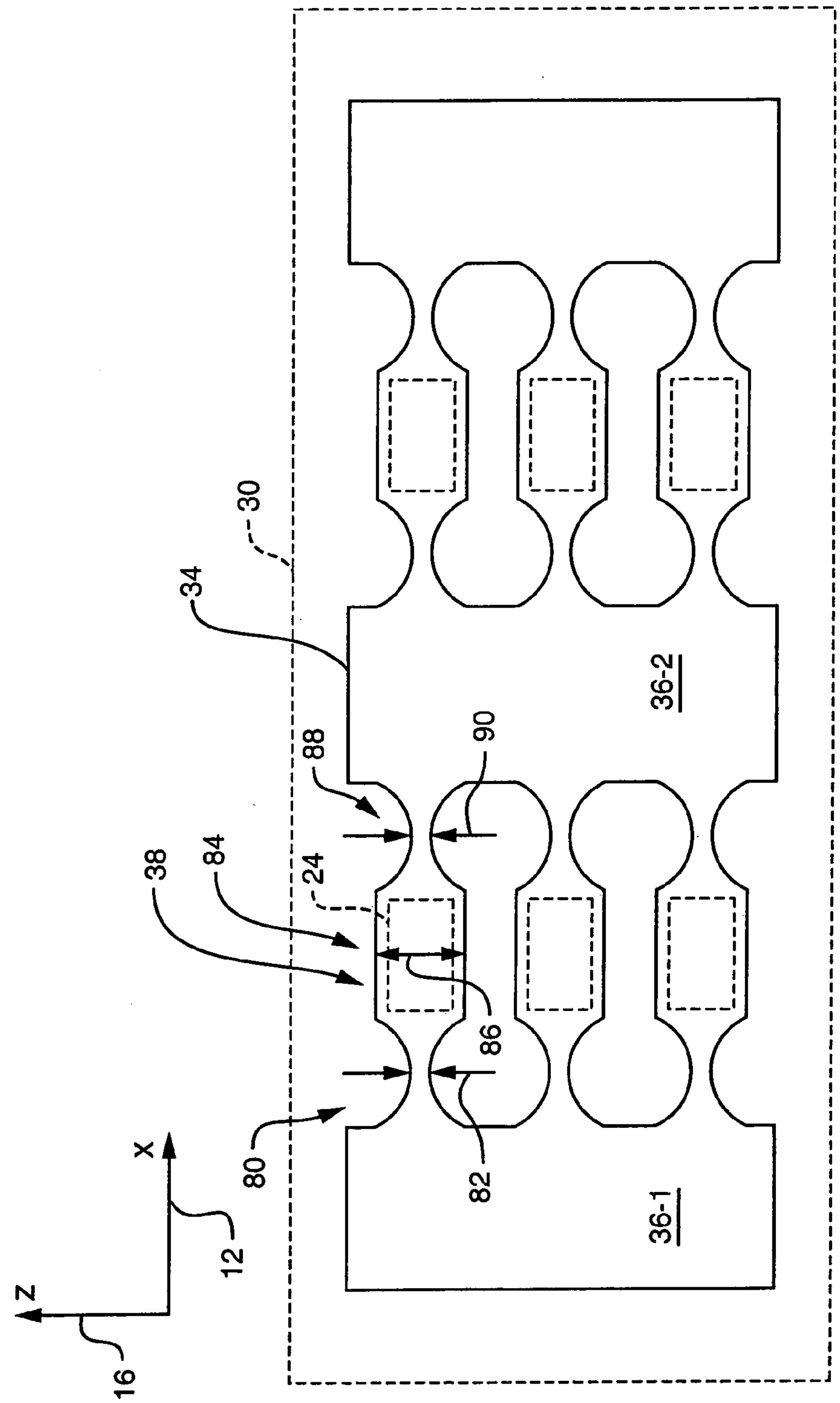
FIG. 5 illustrates a top view of a flexure member of the heat sink assembly, according to another embodiment of the invention.

FIG. 5 illustrates a top view of one arrangement of the flexure member 24 where the geometry of the deflection portion 38 increases the relative compliance (e.g., decreases the stiffness) and of the flexure member 34.

The deflection portion 38 has a first deflection portion 80 defining a first width 82, a central deflection portion 84 integrally formed with the first deflection portion 80 and defining a center width 86, and a second deflection portion 88 integrally formed with the central deflection portion 84 and defining a second width 90. The first deflection portion 80 is integrally formed with a first attachment portion 36-1 of the flexure member 34 while the second deflection portion 88 is integrally formed with a second attachment portion 36-2 of the flexure member 34. As illustrated, the center width 86 of the center deflection portion 84 is greater than either the first width 82 of the first deflection portion 80 or the second width 90 of the second deflection portion 88.

When the flexure member 34 contacts the circuit board component 24, in one arrangement, the central deflection portion 84 contacts the surface 25 of the circuit board component 24 and generates a stress on the circuit board component 24. As described above, in one arrangement, the flexure member 34 is formed from a relatively high-strength material, such as beryllium copper. Such a high-strength material has a relatively low or small compliance, thereby limiting deflection of the deflection portion 38 relative to the circuit board component 24 when the associated heat sink couples to the circuit board 22. In the flexure member 34 of FIG. 4, therefore, the relative widths 82, 90 of the first deflection portion 80 and the second deflection portion 88 provides an increase in the compliance of the flexure member 34 within a plane defined by the z-axis 16 and the x-axis 12. Such an increase in compliance of the flexure member 34 allows the deflection member 38 to conform or adjust to relatively large local tolerance variations in a single circuit board component 24. Furthermore, as is illustrated in FIG. 5, an increase in compliance of the flexure member 34 allows multiple deflection members 38 to conform or adjust to relatively large global tolerance variations among multiple circuit board components 24.

Figure 6:
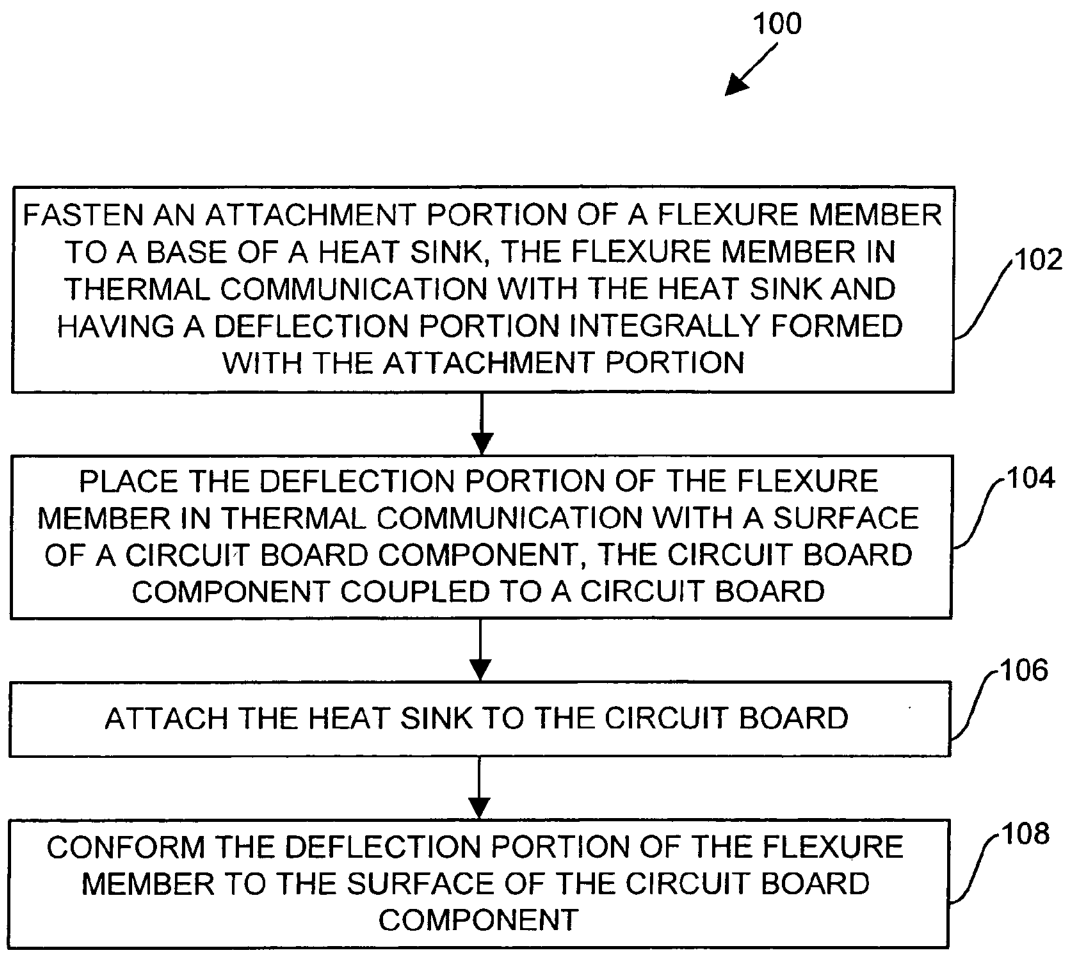
FIG. 6 illustrates a flowchart of procedure for assembling a heat sink assembly, according to one embodiment of the invention.

FIG. 6 illustrates a flowchart for a method 100 of assembling a circuit board assembly. Such assembly can be performed either manually (e.g., by a technician on an assembly line) or automatically (e.g., by automated equipment).

In step 102, an assembler fastens an attachment portion 36 of a flexure member 34 to a base 30 of a heat sink 28 where the flexure member 34 is in thermal communication with the heat sink 28 where the flexure member 34 has a deflection portion 38 integrally formed with the attachment portion 36. In one arrangement, fastening the flexure member 34 to the base 30 of the heat sink 28 provides thermal contact between the flexure member 34 and the heat sink 28.

In step 104, the assembler places the deflection portion 38 of the flexure member 34 in thermal communication with a surface 25 of a circuit board component 24 where the circuit board component 24 is coupled to a circuit board 22.

In step 106, the assembler attaches the heat sink 28 to the circuit board 22. For example, the assembler inserts fasteners 59 associated with the heat sink 28 into corresponding openings 56 defined by the circuit board 22 and engages the fasteners 59 with the openings 56 to secure or attach the heat sink 28 to the circuit board 22.

In step 108, the assembler conforms the deflection portion 38 of the flexure member 34 to the surface 25 of the circuit board component 25. For example, as the assembler attaches the heat sink 28 to the circuit board 22, the heat sink 28 compresses the deflection portion 38 against the surface 25 of the circuit board component 24. In response to the compression, the deflection portion 38 conforms or flattens to the surface 25 of the circuit board component 24. By conforming the deflection portion 38 of the flexure member 34 to the surface 25 of the circuit board component 25 the assembler provides thermal contact between the heat sink 28 and the circuit board component 24 and limits the amount of stress applied to the surface 25 of the circuit board component 24 (e.g., the generated stress being between approximately 10 psi and 15 psi).

In one arrangement, during assembly, the assembler loosely (e.g., non securely) attaches or fastens the attachment portions 36 of the flexure member 34 to the heat sink 30. The non-secure attachment allows the deflection portion 38 of the flexure member 34 to deflect along the y-axis direction 14 relative to the circuit board component 24 and allows the flexure member 34 to translate along the x-axis direction 12 relative to the circuit board component 24 as the assembler attaches the heat sink assembly 26 to the circuit board 22. After the deflection portion 38 of the flexure member 34 conforms to the surface of the circuit board component, the assembler adjusts a fastener 40 of the flexure member 34 to secure the flexure member 34 to the heat sink 30, thereby providing adequate thermal contact between the heat sink 30 and flexure member 34 during operation.

Those skilled in the art will understand that there can be many variations made to the embodiments explained above while still achieving the same objective of those embodiments and the invention in general.

For example, as shown in FIGS. 4 and 5, the flexure member 34 has a substantially rectangular profile. Such a configuration is by way of example only. In one arrangement, a manufacturer configures the geometry of the flexure member 34 based upon the location or number of circuit board components 24 on a circuit board 22 for a particular circuit board assembly 26.

In another example, as shown in FIGS. 1, 2, and 3, the flexure member 24 attaches to a flanged heat sink 24. Such a configuration is by way of example only. In one arrangement, the flexure member 34 is configured to attach to other types of heat sinks, such as folded fin heat sinks, for example.

Such variations are intended to be covered by the scope of this invention. As such, the foregoing description of embodiments of the invention is not intended to be limiting. Rather, any limitations to the invention are presented in the following claims.

The invention claimed is:

1. A heat sink assembly comprising:

a heat sink having a base; and a flexure member configured to position between the base of the heat sink and a circuit board component of a circuit board, the flexure member having:

an attachment portion fastened to, and in thermal communication with, the heat sink, and a deflection portion integrally formed with the attachment portion, the deflection portion configured to thermally communicate with the circuit board component and configured to conform to a surface of the circuit board component during attachment of the heat sink to the circuit board, wherein:

the attachment portion comprises a first attachment portion and a second attachment portion; and the deflection portion comprises a first deflection portion defining a first width and integrally formed with the first attachment portion, a central deflection portion defining a center width and integrally formed with the first deflection portion, and a second deflection portion defining a second width integrally formed with the second attachment portion, the first width of the first deflection portion greater than the central width of the central deflection portion and the second width of the second deflection portion greater than the central width of the central deflection portion.

2. The heat sink assembly of claim 1 wherein the deflection portion defines a substantially curved portion relative to the attachment portion, the substantially curved portion configured to flatten relative to the circuit board component surface during attachment of the heat sink to the circuit board.

3. The heat sink assembly of claim 1 wherein the flexure member comprises:

a plurality of attachment portions fastened to, and in thermal communication with, the heat sink; and a plurality of deflection portions integrally formed with the attachment portions, each of the plurality of deflection portions located between two adjacent attachment portions, each of the plurality of the deflection portions configured to thermally communicate with the circuit board component and configured to conform to the surface of the circuit board component during attachment of the heat sink to the circuit board.

4. The heat sink assembly of claim 1 wherein the deflection portion comprises a compliant thermal interface material configured to contact the surface of the circuit board component.

5. The heat sink assembly of claim 1 wherein the flexure member comprises a copper material.

6. The heat sink assembly of claim 1 wherein the deflection portion is configured to distribute stress over the surface of the circuit board component with attachment of the heat sink to the circuit board.

7. A heat sink assembly comprising:

a heat sink having a base; and a flexure member configured to position between the base of the heat sink and a circuit board component of a circuit board, the flexure member having:

an attachment portion fastened to, and in thermal communication with, the heat sink, and a deflection portion integrally formed with the attachment portion, the deflection portion configured to thermally communicate with the circuit board component and configured to conform to a surface of the circuit board component during attachment of the heat sink to the circuit board, wherein:

the attachment portion comprises a first attachment portion and a second attachment portion; and the deflection portion comprises a first deflection portion defining a first width and integrally formed with the first attachment portion, a central deflection portion defining a center width and integrally formed with the first deflection portion, and a second deflection portion defining a second width integrally formed with the second attachment portion, the center width of the center deflection portion greater than the first width of the first deflection portion and the center width of the center deflection portion greater than the second width of the second deflection portion.

8. A circuit board assembly comprising:

a circuit board;

a circuit board component coupled to the circuit board; and a heat sink assembly having:

a heat sink having a base portion; and a flexure member configured to position between the base of the heat sink and a circuit board component of a circuit board, the flexure member having:

an attachment portion fastened to, and in thermal communication with, the heat sink, and a deflection portion integrally formed with the attachment portion, the deflection portion configured to thermally communicate with the circuit board component and configured to conform to a surface of the circuit board component during attachment of the heat sink to the circuit board, wherein:

the attachment portion comprises a first attachment portion and a second attachment portion; and the deflection portion comprises a first deflection portion defining a first width and integrally formed with the first attachment portion, a central deflection portion defining a center width and integrally formed with the first deflection portion, and a second deflection portion defining a second width integrally formed with the second attachment portion, the first width of the first deflection portion greater than the central width of the central deflection portion and the second width of the second deflection portion greater than the central width of the central deflection portion.

9. The circuit board assembly of claim 8 wherein the deflection portion defines a substantially curved portion relative to the attachment portion, the substantially curved portion configured to flatten relative to the circuit board component surface during attachment of the heat sink to the circuit board.

10. The circuit board assembly of claim 8 wherein the flexure member comprises:

a plurality of attachment portions fastened to, and in thermal communication with, the heat sink; and a plurality of deflection portions integrally formed with the attachment portions, each of the plurality of deflection portions located between two adjacent attachment portions, each of the plurality of the deflection portions configured to thermally communicate with the circuit board component and configured to conform to the surface of the circuit board component during attachment of the heat sink to the circuit board.

11. The circuit board assembly of claim 8 wherein the circuit board component comprises a compliant thermal interface material configured to contact the surface of the circuit board component.

12. The circuit board assembly of claim 8 wherein the flexure member comprises a copper material.

13. The circuit board assembly of claim 8 wherein the deflection portion is configured to distribute stress over the surface of the circuit board component with attachment of the heat sink to the circuit board.

14. A circuit board assembly comprising:

a circuit board;

a circuit board component coupled to the circuit board; and a heat sink assembly having:

a heat sink having a base portion; and a flexure member configured to position between the base of the heat sink and a circuit board component of a circuit board, the flexure member having:

an attachment portion fastened to, and in thermal communication with, the heat sink, and a deflection portion integrally formed with the attachment portion, the deflection portion configured to thermally communicate with the circuit board component and configured to conform to a surface of the circuit board component during attachment of the heat sink to the circuit board, wherein:

the attachment portion comprises a first attachment portion and a second attachment portion; and the deflection portion comprises a first deflection portion defining a first width and integrally formed with the first attachment portion, a central deflection portion defining a center width and integrally formed with the first deflection portion, and a second deflection portion defining a second width integrally formed with the second attachment portion, the center width of the center deflection portion greater than the first width of the first deflection portion and the center width of the center deflection portion greater than the second width of the second deflection portion.

15. A method for assembling a circuit board assembly comprising:

fastening an attachment portion of a flexure member to a base of a heat sink, the flexure member in thermal communication with the heat sink and having a deflection portion integrally formed with the attachment portion;

placing the deflection portion of the flexure member in thermal communication with a surface of a circuit board component, the circuit board component coupled to a circuit board;

attaching the heat sink to the circuit board; and conforming the deflection portion of the flexure member to the surface of the circuit board component, wherein the step of fastening comprises non-securely fastening the attachment portion of the flexure member to the base of the heat sink and wherein the step of conforming further comprises adjusting a fastener of the attachment portion of the flexure member to secure the attachment portion of the flexure member to the heat sink.

16. The method of claim 15 wherein:

the step of fastening comprises coupling a plurality of attachment portions of the flexure member to the base of the heat sink, the flexure member in thermal communication with the heat sink and having a plurality of deflection portions integrally formed with the plurality of attachment portions;

the step of placing comprises placing each of the plurality of deflection portions of the flexure member in thermal communication with corresponding surfaces of a plurality of circuit board components; and the step of conforming comprises conforming each of the plurality deflection portions of the flexure member to the corresponding surface of the plurality of circuit board components.

17. A heat sink assembly comprising:

a heat sink having a base; and a flexure member configured to position between the base of the heat sink and a circuit board component of a circuit board, the flexure member having:

an attachment portion fastened to, and in thermal communication with, the heat sink, and a deflection portion integrally formed with the attachment portion, the deflection portion configured to thermally communicate with the circuit board component and configured to conform to a surface of the circuit board component during attachment of the heat sink to the circuit board, wherein the attachment portion defines a first end in thermal communication with the heat sink and a second end in communication with the heat sink, the first end of the attachment portion and the second end of the attachment portion non-securely fastened to the heat sink prior to attachment of the heat sink to the circuit board and the first end of the attachment portion and the second end of the attachment portion securely fastened to the heat sink after attachment of the heat sink to the circuit board.

18. A circuit board assembly comprising:

a circuit board;

a circuit board component coupled to the circuit board; and a heat sink assembly having:

a heat sink having a base portion; and a flexure member configured to position between the base of the heat sink and a circuit board component of a circuit board, the flexure member having:

an attachment portion fastened to, and in thermal communication with, the heat sink, and a deflection portion integrally formed with the attachment portion, the deflection portion configured to thermally communicate with the circuit board component and configured to conform to a surface of the circuit board component during attachment of the heat sink to the circuit board, wherein the attachment portion defines a first end in thermal communication with the heat sink and a second end in communication with the heat sink, the first end of the attachment portion and the second end of the attachment portion non-securely fastened to the heat sink prior to attachment of the heat sink to the circuit board and the first end of the attachment portion and the second end of the attachment portion securely fastened to the heat sink after attachment of the heat sink to the circuit board.

* * * * *